(12) United States Patent
Kawano et al.

(10) Patent No.: US 6,317,404 B1
(45) Date of Patent: Nov. 13, 2001

(54) OPTICAL RECORDING METHOD AND OPTICAL RECORDING APPARATUS

(75) Inventors: Katsunori Kawano; Mitsuhiro Ishibe; Tsutomu Ishii; Takehiro Niitsu; Kazuo Baba, all of Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/366,346

(22) Filed: Aug. 2, 1999

(30) Foreign Application Priority Data

Aug. 18, 1998 (JP) .................................................. 10-231857

(51) Int. Cl.[7] ....................................................... G11B 7/00
(52) U.S. Cl. ........................................ 369/103; 369/112.01
(58) Field of Search ................................ 369/103, 112.01, 369/112.02, 112.4, 124.01, 100, 53.1, 44.12, 44.23

(56) References Cited

U.S. PATENT DOCUMENTS 5,339,305 * 8/1994 Curtis et al. .
5,510,912 * 4/1996 Blaum et al. ........................... 365/21
6,088,321 * 7/2000 Yamaji et al. ....................... 369/103

FOREIGN PATENT DOCUMENTS

A-55-41480   3/1980 (JP) .
A-10-340479 12/1998 (JP) .

OTHER PUBLICATIONS

Psaltis, Demetri et al., "Holographic Storage Using Shift Multiplexing," Optics Letters, vol. 20, No. 7, 1995, pp. 782–784.

* cited by examiner

*Primary Examiner*—Muhammad Edun
(74) *Attorney, Agent, or Firm*—Oliff & Berridge, PLC

(57) ABSTRACT

Binary two-dimensional digital data can be recorded in an optical recording medium as holograms in such a way that a recording area is made sufficiently minute correspondingly to the two-dimensional digital data by adequately limiting the spread of signal light and reference light without causing loss of the data and a read error during reconstructing. Signal light of a binary two-dimensional digital data image is subjected to Fourier transform by a lens. There is disposed forwardly of an optical recording medium a shading material having a circular, semicircular, sectorial, or L-shape light transmission part 21 that allows transmission of only components of 0th to n-th (n=1, 2, or 3) orders. The signal light after Fourier transform and reference light are transmitted through the light transmission part 21 for irradiation to the optical recording medium and a Fourier transform hologram is recorded in the optical recording medium.

14 Claims, 5 Drawing Sheets

POLYESTER HAVING CYANOAZOBENZENE IN SIDE CHAIN

CIRCLE

SEMICIRCLE

SECTOR

L SHAPE

OPTICAL RECORDING METHOD AND OPTICAL RECORDING APPARATUS

BACKGROUND OF THE INVENTION

1. Field of the Invention

The present invention relates to an optical recording method and an optical recording apparatus for recording binary two-dimensional digital data page in an optical recording medium as a hologram.

2. Description of the Related Art

A holographic memory is in the limelight as a computer file memory of the next generation which has large capacity derived from three-dimensional recording areas and high speed derived from a two-dimensional page recording/reconstructing method. The holographic memory allows a plurality of data pages to be recorded within an identical volume, and entire data to be read for each page all at once. Instead of producing an analog image, by converting binary values 0 and 1 of digital data into a digital image such that they are made to correspond to "bright" and "dark", respectively, and recording and reconstructing the digital image as a hologram, the digital data can be recorded and reconstructed. In recent years, there have been proposed a detailed optical system of the digital holographic memory system, evaluation of an S/N ratio and a bit error rate based on a volume multiple recording method, and two-dimensional coding, and headway is being made in research from a more optical point of view such as influence of aberration of an optical system.

FIG. 8 shows a shift multiplexing system as one example of a volume multiple recording system described in the literature "D. Psaltis, M. Levene, A. Pu, G. Barbastathis and K. Curtis; OPTICS LETTERS Vol. 20, No. 7 (1995), p782".

The shift multiplexing system uses signal light 31 and a spherical wave as reference light 32 irradiated onto a hologram recording medium 35, and overwrites a plurality of holograms in the same area by rotating the hologram recording medium 35 of disk shape. For example, letting a beam diameter be 1.5 mm, shifting the disk 35 as short as tens of micrometers enables another hologram to be recorded in almost the same area without causing crosstalk. This uses the nature that shifting the disk 35 is equivalent to changing angles of the reference light 32, which is a sphere wave.

A shift distance of the spherical reference wave shift multiplexing, that is, a distance $\delta$ with which mutual holograms can be separated without significant crosstalk, is represented by the following expression as described in the above described literature.

$$\delta\text{spherical} = \delta\text{Bragg} + \delta\text{NA} \approx (\lambda z_o / L\tan\theta_s) + \lambda/2(NA) \quad (1)$$

where $\lambda$ is the wavelength of signal light, $z_o$ is the distance between an objective lens for forming a spherical reference wave and a recording medium, L is the film thickness of the recording medium, $\theta_s$ is a crossing angle of the signal light and the spherical reference wave, and NA is the numerical aperture of the above described objective lens.

It can be found from the expression (1) that the greater the film thickness L of a recording medium, the smaller the shift quantify $\delta$ and the greater multiplicity, contributing to an increase of recording capacity. Furthermore, the recording capacity could be increased more effectively in the shift multiplexing system by making a recording area minute. Multiple recording in a minute area makes it possible to achieve volume multiplexing of higher density.

To achieve the above object, the holographic memory system subjects signal light to Fourier transform by a lens before making irradiation to a recording medium. By this process, when an image of the signal light has a fine pitch (high spatial frequency), the signal light is subjected to large Fraunhofer diffraction on the recording medium and the spread $\zeta$ of the diffracted image is represented by the following expression.

$$\zeta = k\lambda f \omega x \quad (2)$$

where k is a proportionality constant, $\lambda$ is the wave length of signal light, f is the focal length of a lens for Fourier transform, and $\omega x$ is the spatial frequency of signal light.

Accordingly, if a lens whose focal length f is small is used as a lens for Fourier transform, a recording area can be made minute. This is described in Chapter 7 of "Holography" (The Institute of Electronics and Communication Engineers of Japan), for example.

Furthermore, a recording area can also be made minute by disposing an aperture forwardly of a storage medium. As described in, e.g., Japanese Published Unexamined Patent Application No. Sho 55-41480, by disposing forwardly of a recording medium an aperture board 39 having a circular aperture 38 whose light transmittance increases gradually toward the center thereof as shown in FIG. 9, meaningless spread of signal light and reference light is limited to make a recording area minute.

However, mere limitation of meaningless spread of signal light and reference light by a circular aperture as in the above described Japanese Published Unexamined Patent Application No. Sho 55-41480 is not sufficient to make a recording area minute to a desired level. Particularly, when binary two-dimensional digital data is recorded in an optical recording medium as holograms, in order to increase a recording capacity, a storage area must be made minute correspondingly to the two-dimensional digital data by limiting the spread of signal light and reference light without causing loss of the data and a read error during reconstructing.

SUMMARY OF THE INVENTION

The present invention makes it possible to record binary two-dimensional digital data in an optical recording medium as holograms in such a way that a recording area is made sufficiently minute correspondingly to the two-dimensional digital data by adequately limiting the spread of signal light and reference light without causing loss of the data and a read error during reconstructing.

An optical recording method according to the present invention transmits light resulting from subjecting signal light of a binary two-dimensional digital data image to Fourier transform by a lens and reference light through a light transmission part for irradiation to an optical recording medium and records a hologram of a predetermined shape and size, wherein the light transmission part is formed in part of a shading material disposed forwardly of the optical recording medium and has a predetermined shape and size corresponding to the Fourier transform image of the signal light.

According to the above described optical recording method of the present invention, signal light after Fourier transform and reference light transmit through a light transmission part of a predetermined shape and size corresponding to a Fourier transform image of the signal light and are irradiated to an optical recording medium. Accordingly, correspondingly to two-dimensional digital data, the spread of signal light and reference light can be sufficiently limited without causing loss of data and a read error during reconstructing, and a recording area can be made sufficiently minute.

DESCRIPTION OF THE PREFERRED EMBODIMENTS

Figure 1:
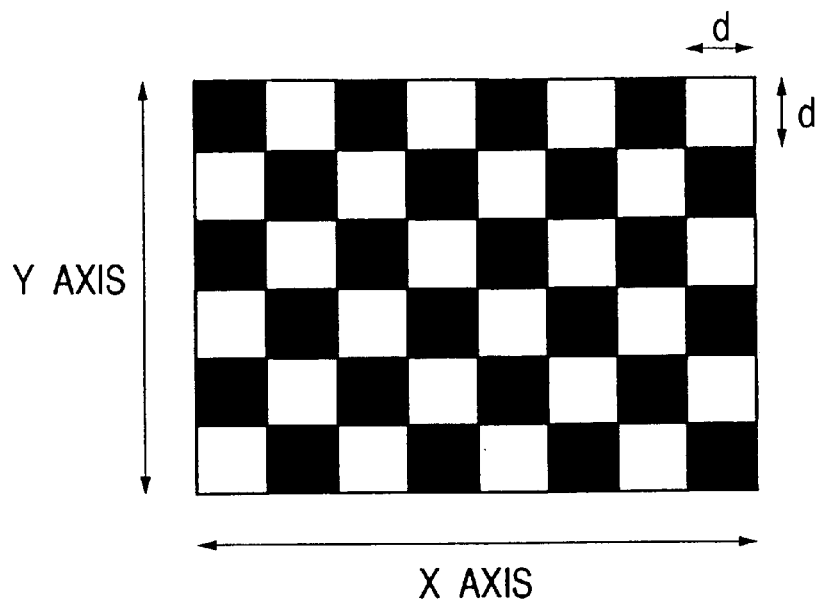
FIG. 1 shows an example of signal light used in the present invention.

Assume that a data page recorded as a hologram is an image as shown in FIG. 1, for example. By white and black portions in the figure being represented by data "1" and "0", respectively, binary two-dimensional digital data can be recorded for each page. In this case, the size of a d by d pixel corresponds to one-bit data.

Figure 2:
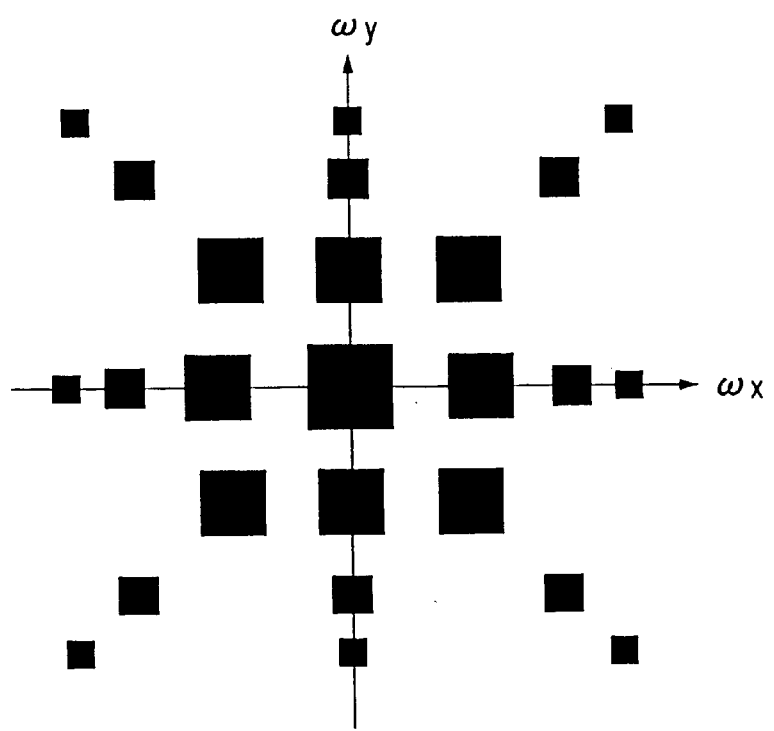
FIG. 2 shows a Fourier transform image of the signal light of FIG. 1.

When such a data image is recorded as a hologram, in order to improve a recording density or provide shift invariant properties to the hologram, a Fraunhofer diffracted image of the data image is recorded by a lens. The Fraunhofer diffracted image is called a Fourier transform hologram because it is proportional to Fourier transform of the amplitude distribution of the data image as shown in FIG. 1. FIG. 2 shows a Fourier transform image of the data image of FIG. 1. This can be obtained by the above described expression (2).

To record digital data in high density requires packing more bit data within one page by reducing the dimension of one pixel of a data image as shown in FIG. 1, that is, reducing the value of d. This achieves fast recording/reconstructing in addition to dense recording.

However, reducing the dimension of one pixel would widen a Fourier transform image of a data image of signal light on an optical recording medium in accordance with the expression (2). This is because reducing a data image of signal light, that is, reducing the value of d would increase a spatial frequency $\omega x$ that is proportional to 1/d. The spread of the Fourier transform image hinders dense recording.

Possible methods for avoiding this situation include a method of reducing the wavelength $\lambda$ of signal light and a method of forming a Fourier transform image of signal light using a lens whose focal length f is short. However, even if a Fourier transform image is shortened by reducing the wavelength $\lambda$ of a light source or the focal length f of a lens, since the Fourier transform image, in principle, has an infinite spread on the focus surface, a storage area cannot be made sufficiently minute.

In the present invention, a data image as shown in FIG. 1 is recorded as a hologram in such a way that only a minimum of Fourier transform portions required for data reconstruction of a Fourier transform image as shown in FIG. 2 are fetched by a light transmission part formed in part of a shading material.

The spread of the x-axis direction of the Fourier transform image shown in FIG. 2 corresponds to spatial frequencies $\omega x$ of the x-axis direction of the data image shown in FIG. 1. With respect to the x-axis direction, the Fourier transform image spreads symmetrically in the plus and minus directions with 0th-order light ($\omega x=0$) at the center. The same goes for the y-axis direction. As described above, although spatial frequencies have plus and minus values, components of either of the signs suffice to reconstruct a data image of signal light. Accordingly, a recording area can be made minute, for example, by fetching and recording only plus components including 0th-order light by a light transmission part.

Furthermore, since a Fourier transform image of signal light contains a lot of spatial frequency components derived from a pixel pitch of the signal light, the signal light can be reconstructed without errors even if harmonic components are cut. An explanation of this follows. If spatial frequencies of image data assume properly normalized values from the beginning, since the Fraunhofer diffracted image shown in FIG. 2 is a Fourier transform image itself of signal light, k of the expression (2) becomes 1 and the spread $\zeta$ of the Fraunhofer diffracted image is represented by:

$$\zeta = \lambda f \omega x \qquad (3)$$

Specific values will be assigned to calculate the spread $\zeta$ of a diffracted image. For example, when wavelength $\lambda$ is 500 nm, focal length f is 10 cm, and spatial frequency $\omega x$ is 25 lines/mm (equivalent to a 40 $\mu$m by 40 $\mu$m pixel), the spread $\zeta$ of a diffracted image is 1.25 mm and is 2.5 mm for the combination of plus and minus components. Furthermore, as shown in FIG. 2, a diffracted image appears as discontinuous and periodical patterns at an interval of 1.25 mm.

Because of the above-described fact, in a preferred embodiment of an optical recording method of the present invention, a light transmission part of a shading material is shaped and sized so as to transmit only Fourier transform components defined by the following expression:

$$0 \leq \xi \leq nf\lambda/d \qquad (4)$$

where $\xi$ is the spread of a Fourier transform image of signal light from 0th-order light and n is 1, 2, or 3.

Specifically, in the preferred embodiment of an optical recording method of the present invention, only components of 0th and first orders, 0th to second orders, or 0th to third orders of a Fourier transform image of signal light are fetched by a light transmission part of a shading material and recorded. More preferably, with n=2, only components of 0th to second orders of a Fourier transform image are fetched by the light transmission part and recorded.

Although recording only components of 0th-order of a Fourier transform image makes it possible to make a recording area the minutest, a data image of signal light could not be read because of loss of data. To avoid loss of data, components of at least 0th and first orders of a Fourier transform image must be recorded.

Conversely, although recording components of high orders such as fourth or fifth order makes it possible to read a data image of signal light at a high S/N ratio, a recording area could not be made sufficiently minute, so that a recording capacity could not be sufficiently increased. Actually, recording components of up to the first order of a Fourier transform image would cause few read errors during reconstructing. Furthermore, recording second-order or third-order components would make it possible to read a data image of signal light at a sufficiently high S/N ratio.

Accordingly, by fetching only components of 0th and first orders, 0th to second orders, or 0th to third orders of a Fourier transform image of signal light by a light transmission part of a shading material and recording them, a recording area can be made sufficiently minute without causing loss of data and read errors during reconstructing. Particularly, by fetching only components of 0th to second orders of a Fourier transform image by a light transmission part and recording them, a recording area can be made minute and an S/N ratio during reconstructing can be made higher.

Figure 3A:
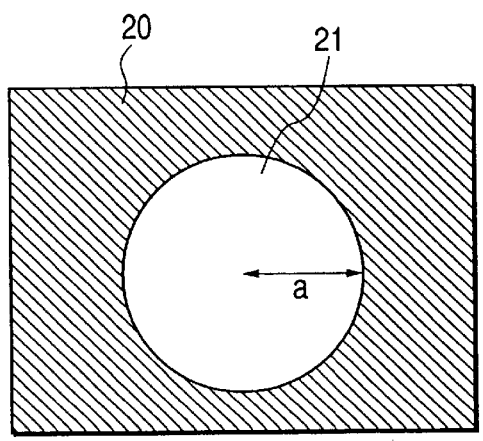
FIG. 3 shows examples of a light transmission part of a shading material used in the present invention.

FIGS. 3A to D each show examples of shading materials used for an optical recording method of the present invention. FIG. 3A shows a circular light transmission part 21 having a radius of a of a shading material 20 that allows transmission of 0th-order components of a Fourier transform image of signal light and the first-order and second-order components of minus and plus directions for each axis direction.

Figure 3B:
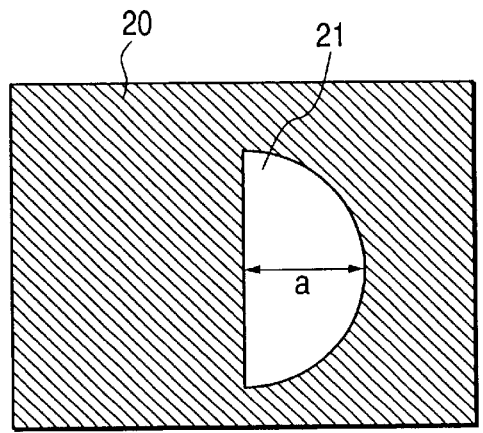

FIG. 3B shows a semicircular light transmission part 21 having a radius of a that allows transmission of 0th-order components of a Fourier transform image of signal light, and first-order and second-order components of plus and minus directions for the y-axis direction, or of the plus direction for other axis directions.

Figure 3C:
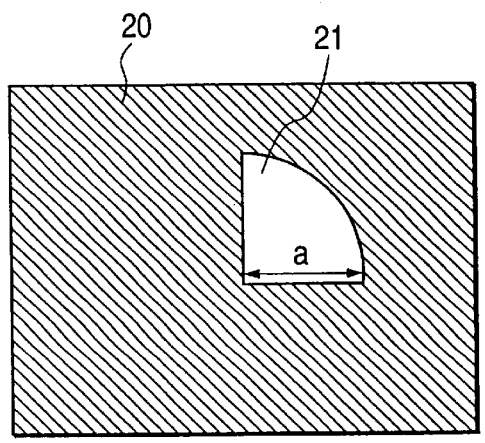

FIG. 3C shows a sectorial (quarter circle) light transmission part 21 having a radius of a that allows transmission of 0th-order components of a Fourier transform image of signal light and, for each of x-axis and y-axis directions, the first-order and second-order components of plus direction, and of directions between the X-axis plus direction and Y-axis plus direction.

Figure 3D:
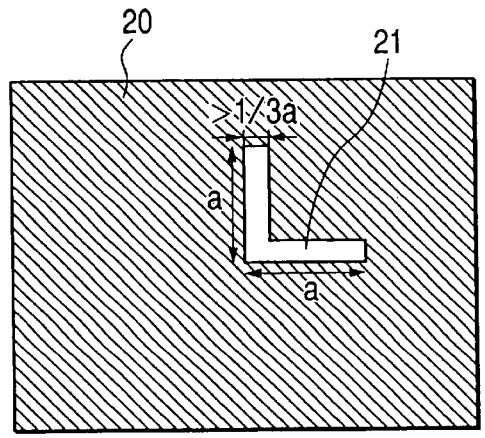

FIG. 3D shows an L-shape light transmission part 21 having a side length of a and a width of a/3 or less that allows transmission of 0th components of a Fourier transform image of signal light, and the first-order and second-order components of plus direction for each of x-axis and y-axis directions.

Figure 4:
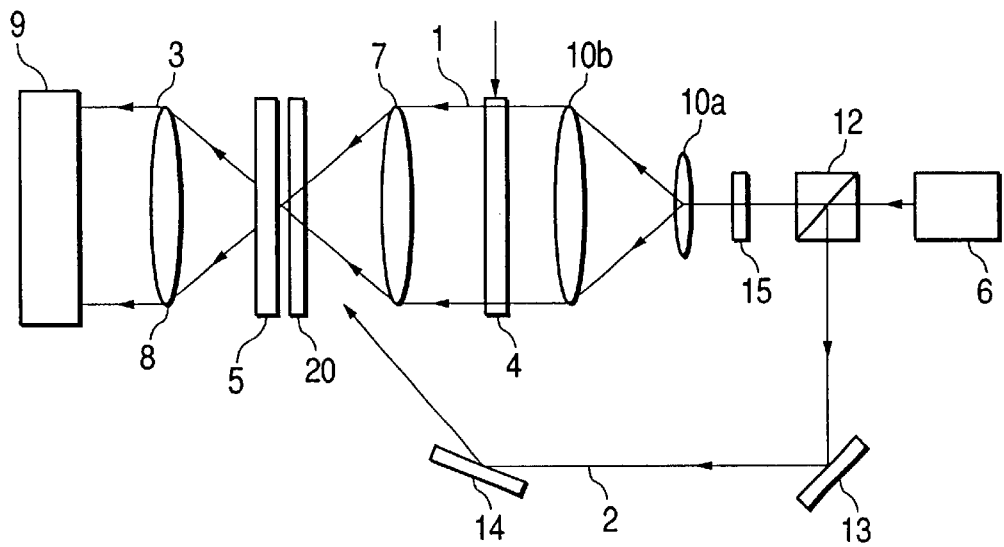
FIG. 4 shows an embodiment of an optical recording method and an optical recording apparatus of the present invention.

FIG. 4 shows an embodiment of an optical recording method and an optical recording apparatus of the present invention. The above-described shading material 20 is disposed forwardly of an optical recording medium 5. Coherent light from a light source 6 is split into two beams of light in a beam splitter 12. During recording, a shutter 15 is opened and light passing through the beam splitter 12 is collimated to be a large aperture by lenses 10a and 10b before incidence into a spatial light modulator 4.

The spatial light modulator 4 uses a computer (not shown) to display a binary two-dimensional digital data image as shown in FIG. 1. By this process, light beams passing through the spatial light modulator 4 are modulated in intensity in accordance with binary data of each pixel of the data image and turn into signal light 1 having information of the data image as shown in FIG. 1.

The signal light 1 is subjected to Fourier transform by a lens 7 and is irradiated to an optical recording medium 5 through the above-described light transmission part of the shading material 20.

At the same time, a light beam reflected in the beam splitter 12 is reflected in mirrors 13 and 14 as reference light 2 and, through the light transmission part of the shading material 20, is irradiated to an area of the optical recording medium 5 to which the signal light 1 subjected to Fourier transform is, irradiated. By this process, the signal light 1 subjected to Fourier transform and the reference light 2 interfere with each other in the optical recording medium 5 and a Fourier transform hologram is recorded.

During reading, the shutter 15 is closed to block the signal light 1 and the same light as the reference light 2 used during recording is, as read light, transmitted through the light transmission part of the shading material 20 and is irradiated to an area of the optical recording medium 5 in which a hologram is recorded. The irradiated read light 2 is diffracted by the hologram.

The diffracted light 3 is subjected to inverse Fourier transform by the lens 8 to form an image on a photodetector 9 such as CCD, and image data of the signal light 1 is read.

Figure 5:
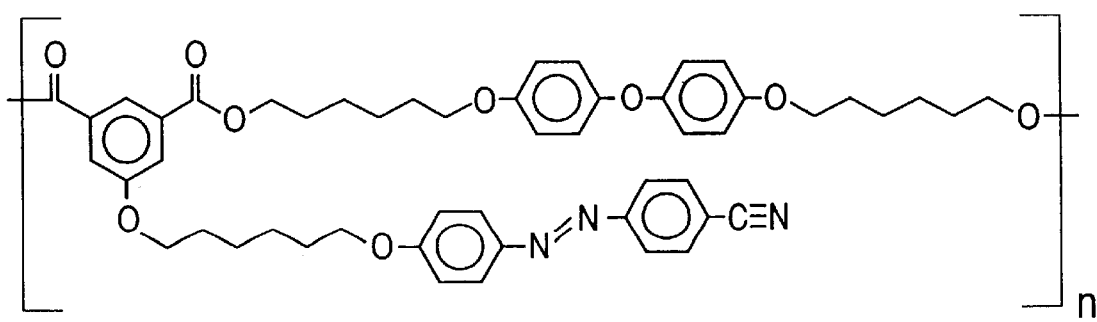
FIG. 5 shows a chemical formula of an optical recording medium used in the present invention.
Figure 6A:
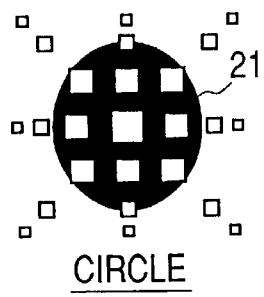
FIG. 6 shows positional relationships between Fourier transform images in an embodiment and the light transmission part.
Figure 6B:
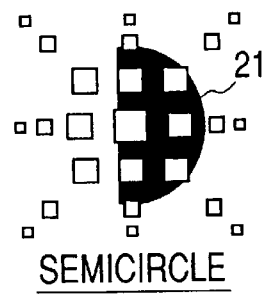
Figure 6C:
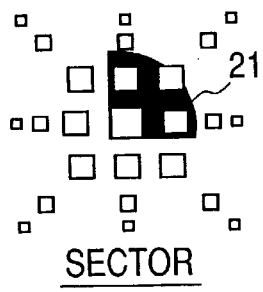
Figure 6D:
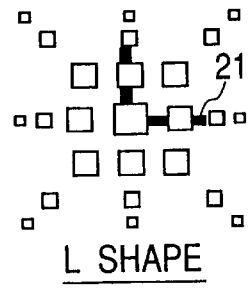

Recording/reconstructing was actually performed by the above-described method. An optical recording medium 5, which is whatever is capable of recording holograms, herein uses polyester having cyanoazobenzene units in the side chain, represented by a chemical formula shown in FIG. 5. As described in Japanese Published Unexamined Patent Application No. Hei 10-340479 (U.S. patent application Ser. No. 09/056,798), this material is capable of recording, reproducing, and erasing holograms by photoinduced anisotropy (photoinduced birefringence, photoinduced dichroism) due to photoisomerization of cyanoazobenzene units in side chain.

The optical recording apparatus shown in FIG. 4 was used to record data images. As the light source 6, a wavelength 515 nm of argon ion laser sensitive to the polyester having cyanoazobenzene units in the side chain, was used.

As the spatial light modulator 4, there was used a liquid crystal panel 1.3 inch size for a projector having 640 by 480 pixels, each 40 $\mu$m by 40 $\mu$m in size. With one pixel as one bit, a chess board pattern shown in FIG. 1 was created by a computer and was input to the spatial light modulator 4. Accordingly, a data image of the signal light 1 has a spatial frequency component corresponding to a pitch of d (=40 $\mu$m).

As the lens 7 for subjecting the signal light 1 to Fourier transform, there were used two types of lenses the focal lengths f of which were 55 mm and 100 mm, respectively. By doing this, the spread of a Fourier transform image due to the difference between the focal lengths of the lens 7 was evaluated.

As light transmission parts of the shading material 20, there were used a circle type of 0.63 mm and 1 mm as radius a as shown in FIG. 3(A), a semicircle type of 0.7 mm and 1.1 mm as radius a as shown in FIG. 3B, a sector type of 0.75 mm and 1.25 mm as radius a as shown in FIG. 3C, and an L-shape type of 1.4 mm and 2.6 mm as side a as shown in FIG. 3D.

By these light transmission parts, respectively, only predetermined components of a Fourier transform image of the signal light 1 were fetched and Fourier transform holograms were recorded in the optical recording medium 5. At this time, Fourier transform images and light transmission parts were in positional relationships as shown in FIGS. 6A to 6D. Unlike FIGS. 2 and 3, each component of a Fourier transform image is indicated in white and the light transmission parts in black.

An attempt was made to read data from the holograms recorded as described above, by the optical reading apparatus shown in FIG. 4. As the light source 6, there was used the same wavelength 515 nm of an argon ion laser that was used during recording. The shutter 15 was closed to block the signal light 1 and the same light as the reference light 2 was irradiated to the optical recording medium 5 as read light.

As a result, in the case where a lens having a focal length of 100 mm was used as lens 7, when holograms had been recorded by fetching only predetermined components of a Fourier transform image of signal light 1 by the respective light transmission parts of a circle whose radius a was 1 mm, a semicircle whose radius a was 1.1 mm, a sector whose radius a was 1.25 mm, and L shape whose side a was 2.6 mm, the same chess board pattern as for the signal light 1 was clearly reconstructed as diffracted light 3 during reading.

Also, in the case where a lens having a focal length of 55 mm was used as lens 7, when holograms had been recorded by fetching only predetermined components of a Fourier transform image of signal light 1 by the respective light transmission parts of a circle whose radius a was 0.63 mm, a semicircle whose radius a was 0.7 mm, a sector whose radius a was 0.75 mm, and L shape whose side a was 1.4 mm, the same chess board pattern as for the signal light 1 was clearly reconstructed as diffracted light 3 during reading.

Figure 7:
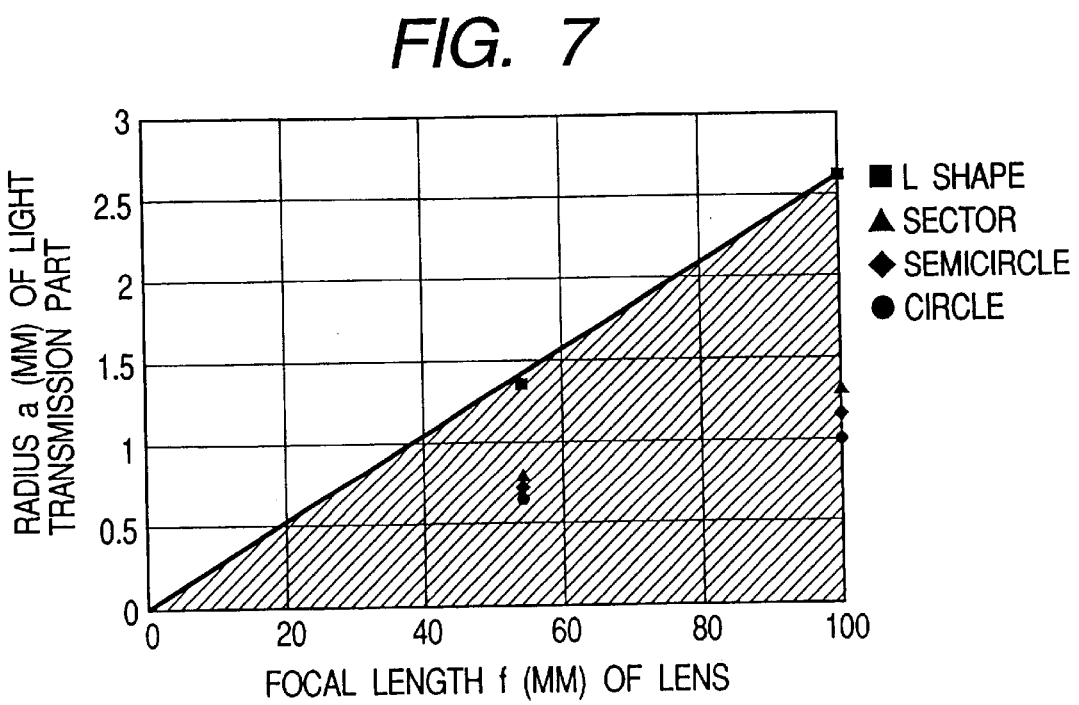
FIG. 7 shows a relationship between focal lengths of a lens for Fourier transform in an embodiment and the radiuses of the light transmission part.
Figure 8:
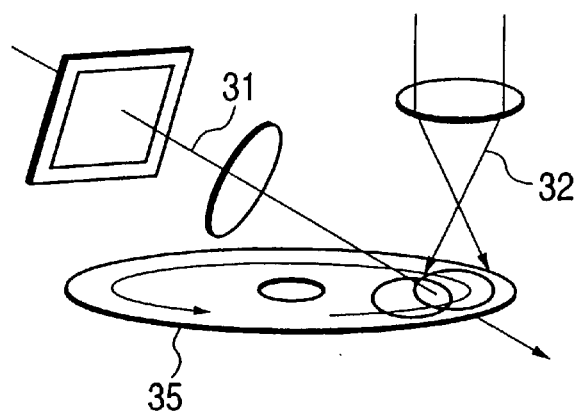
FIG. 8 illustrates a shift multiplexing system.
Figure 9:
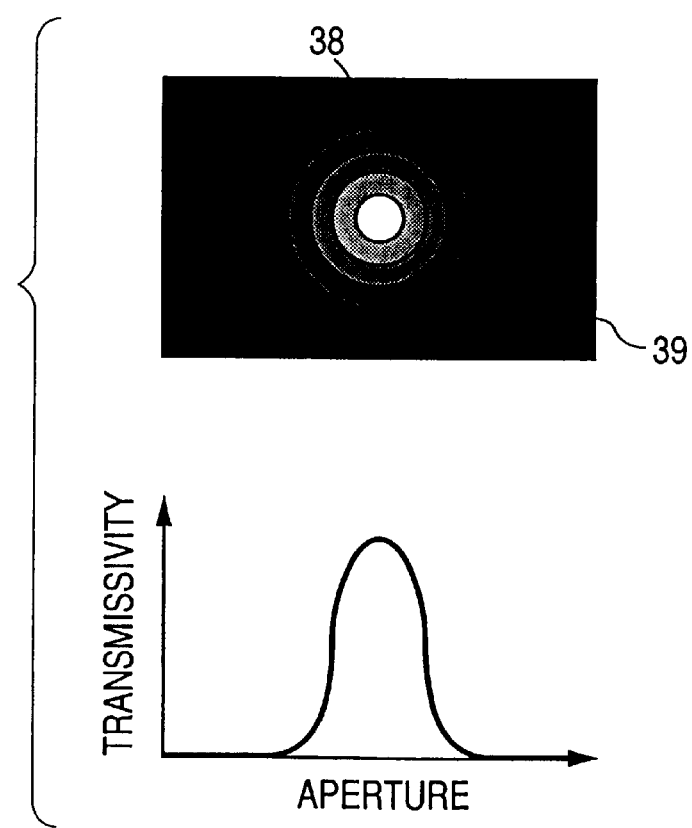
FIG. 9 illustrates a conventional optical recording method.

FIG. 7 shows these results. The horizontal axis of the figure indicates the focal length f of lens 7 and the vertical axis indicates the radius (side) a of the light transmission part. The shaded portion in the figure indicates the range of the radius (side) a of the light transmission part that transmits only components of 0th to second orders of a Fourier transform image of signal light 1 with respect to the focal length f of lens 7. In this case, d =40 $\mu$m.

It can be understood from the results that a storage area can be made sufficiently minute without causing loss of data and read errors during reconstructing by fetching only components of 0th to second orders of a Fourier transform image of signal light by the light transmission part and recording them.

As described above, according to an optical recording method and an optical recording apparatus of the present invention, binary two-dimensional digital data can be recorded in an optical recording medium as holograms in such a way that a recording area is made sufficiently minute correspondingly to the two-dimensional digital data by adequately limiting the spread of signal light and reference light without causing loss of the data and a read error during reconstructing. Accordingly, an optical recording method of the present invention makes it possible to build a large-capacity digital holographic memory system in combination with holographic multiplexing systems such as shift multiplexing, angle multiplexing, and wavelength multiplexing.

What is claimed is:

1. An optical recording method, comprising the steps of:
    transmitting light resulting from subjecting signal light of a binary two-dimensional digital data image to Fourier transform by a lens and reference light through a light transmission part for irradiation to an optical recording medium; and recording a hologram of a predetermined shape and size in said optical recording medium, wherein said light transmission part is formed in part of a shading material disposed forwardly of said optical recording medium and has a predetermined shape and size corresponding to a Fourier transform image of said signal light.

2. The optical recording method according to claim 1, wherein said light transmission part is shaped and sized so as to transmit only Fourier transform components defined by the following expression:

$$0 \leq \zeta \leq nf\lambda/d$$

where $\zeta$ is the spread of a Fourier transform image of said signal light from 0th-order light, f is the focal length of said lens, $\lambda$ is the wavelength of said signal light, d is the length of a side of one-bit data of said signal light, and n is 1, 2, or 3.

3. The optical recording method according to claim 2, wherein n is 2.

4. The optical recording method according to claim 1, wherein said light transmission part is circular.

5. The optical recording method according to claim 1, wherein said light transmission part is semicircular.

6. The optical recording method according to claim 1, wherein said light transmission part is sectorial.

7. The optical recording method according to claim 1, wherein said light transmission part is of L shape.

8. An optical recording apparatus, comprising:
    a light source emitting coherent light;
    a spatial light modulator that modulates light from said light source in accordance with binary two-dimensional digital data and obtains signal light holding a two-dimensional digital data image by the wave-front thereof;
    a lens for subjecting said signal light to Fourier transform;
    a reference light optical system for obtaining reference light from light of said light source; and
    a shading material, in part of which a light transmission part having a predetermined shape and size corresponding to a Fourier transform image of said signal light is formed, and which is disposed forwardly of an optical recording medium, that allows transmission of said signal light after Fourier transform and said reference light through the light transmission part for irradiation to said optical recording medium.

9. The optical recording apparatus according to claim 8, wherein said light transmission part is shaped and sized so as to transmit only Fourier transform components defined by the following expression:

$$0 \leq \zeta \leq nf\lambda/d$$

where $\zeta$ is the spread of a Fourier transform image of said signal light from 0th-order light, f is the focal length of said lens, $\lambda$ is the wavelength of said signal light, d is the length of a side of one-bit data of said signal light, and n is 1, 2, or 3.

10. The optical recording apparatus according to claim 9, wherein n is 2.

11. The optical recording apparatus according to claim 8, wherein said light transmission part is circular.

12. The optical recording apparatus according to claim 8, wherein said light transmission part is semicircular.

13. The optical recording apparatus according to claim 8, wherein said light transmission part is sectorial.

14. The optical recording apparatus according to claim 8, wherein said light transmission part is of L shape.

* * * * *